United States Patent
Schulz

(10) Patent No.: US 8,324,720 B2
(45) Date of Patent: Dec. 4, 2012

(54) POWER SEMICONDUCTOR MODULE ASSEMBLY WITH HEAT DISSIPATING ELEMENT

(75) Inventor: Martin Schulz, Erwitte (DE)

(73) Assignee: Infineon Technologies AG, Neubiberg (DE)

( * ) Notice: Subject to any disclaimer, the term of this patent is extended or adjusted under 35 U.S.C. 154(b) by 486 days.

(21) Appl. No.: 12/563,843

(22) Filed: Sep. 21, 2009

(65) Prior Publication Data

US 2010/0078807 A1 Apr. 1, 2010

(30) Foreign Application Priority Data

Sep. 19, 2008 (DE) .......................... 10 2008 048 005

(51) Int. Cl.
*H01L 23/52* (2006.01)
*H01L 23/34* (2006.01)

(52) U.S. Cl. ........ 257/691; 257/706; 257/713; 257/698; 257/728; 257/E23.101

(58) Field of Classification Search .................. 257/706, 257/713, 691, 698, E23.101, 6
See application file for complete search history.

(56) References Cited

U.S. PATENT DOCUMENTS

| 4,878,152 | A | | 10/1989 | Sauzade et al. | |
| 5,144,747 | A | * | 9/1992 | Eichelberger | 29/834 |
| 5,698,898 | A | * | 12/1997 | Matsumoto | 257/712 |
| 5,719,438 | A | * | 2/1998 | Beilstein et al. | 257/686 |
| 6,407,922 | B1 | | 6/2002 | Eckblad et al. | |
| 6,597,063 | B1 | * | 7/2003 | Shimizu et al. | 257/687 |
| 7,671,382 | B2 | * | 3/2010 | Sudo et al. | 257/181 |
| 2007/0138624 | A1 | * | 6/2007 | Sudo et al. | 257/706 |
| 2007/0176277 | A1 | | 8/2007 | Brunnbauer et al. | |
| 2008/0128898 | A1 | * | 6/2008 | Henderson et al. | 257/713 |
| 2010/0187670 | A1 | * | 7/2010 | Lin et al. | 257/686 |

FOREIGN PATENT DOCUMENTS

| DE | 102006008807 A1 | 9/2007 |
| JP | 2004088660 A | 3/2004 |

* cited by examiner

*Primary Examiner* — Nitin Parekh

(74) *Attorney, Agent, or Firm* — Dicke, Billig & Czaja, PLLC

(57) ABSTRACT

A power semiconductor module assembly is disclosed including a power semiconductor module comprising a load terminal electrically conductively joined to a contact conductor. Part of the heat materializing during operation of the power semiconductor module in the load terminal is dissipated by using a heat dissipating element.

18 Claims, 7 Drawing Sheets

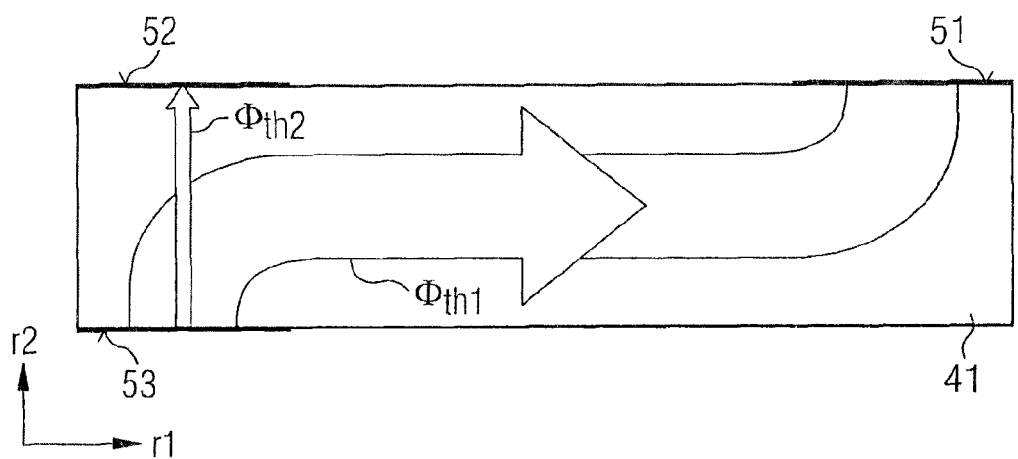
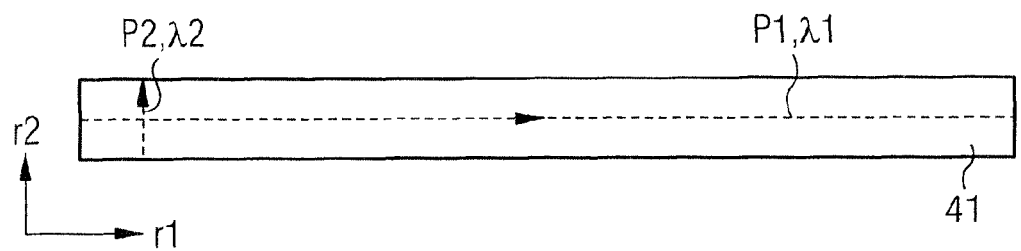

POWER SEMICONDUCTOR MODULE ASSEMBLY WITH HEAT DISSIPATING ELEMENT

CROSS-REFERENCE TO RELATED APPLICATIONS

This Utility Patent Application claims priority to German Patent Application No. DE 10 2008 048 005.3-33 filed on Sep. 19, 2008, which is incorporated herein by reference.

BACKGROUND

The invention relates to an assembly including a power semiconductor module.

Power semiconductor modules include at least one power semiconductor chip which in module operation dissipates waste heat. For the purpose of their electrical contacting such modules further include low-resistance terminals electrically conductively joined to one or more semiconductor chips. In operation of the power semiconductor module such a terminal may be subjected to quite considerable heating of an electric component joined to the terminal, for example, a capacitor or some other power semiconductor module, possibly resulting in the electric component being damaged or even ruined, but in any case diminishing the useful life of the electric component.

One cause for such a terminal becoming overheated is a flow of heat materializing in the at least one power semiconductor chip joined to the terminal and flowing in the direction of the terminal. Another cause is the power loss generated by the terminal itself, resulting from its electrical resistance, as the product of the latter and the square of the current flowing through the terminal. Such power semiconductor modules are usually required to handle currents as high as several 100 A making a high power loss possible even when a very low electrical resistance is involved.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The invention will now be detailed by way of example embodiments with reference to the drawings.

FIG. 1C is a vertical section through the heat dissipating element illustrated in FIGS. 1A and 1B depicting qualitatively the heat flows resulting from the thermal resistors illustrated in FIG. 1B.

FIG. 2 is a cross-section through a planar anisotropic thermally conductive heat dissipating element.

DETAILED DESCRIPTION

Figure 1A:
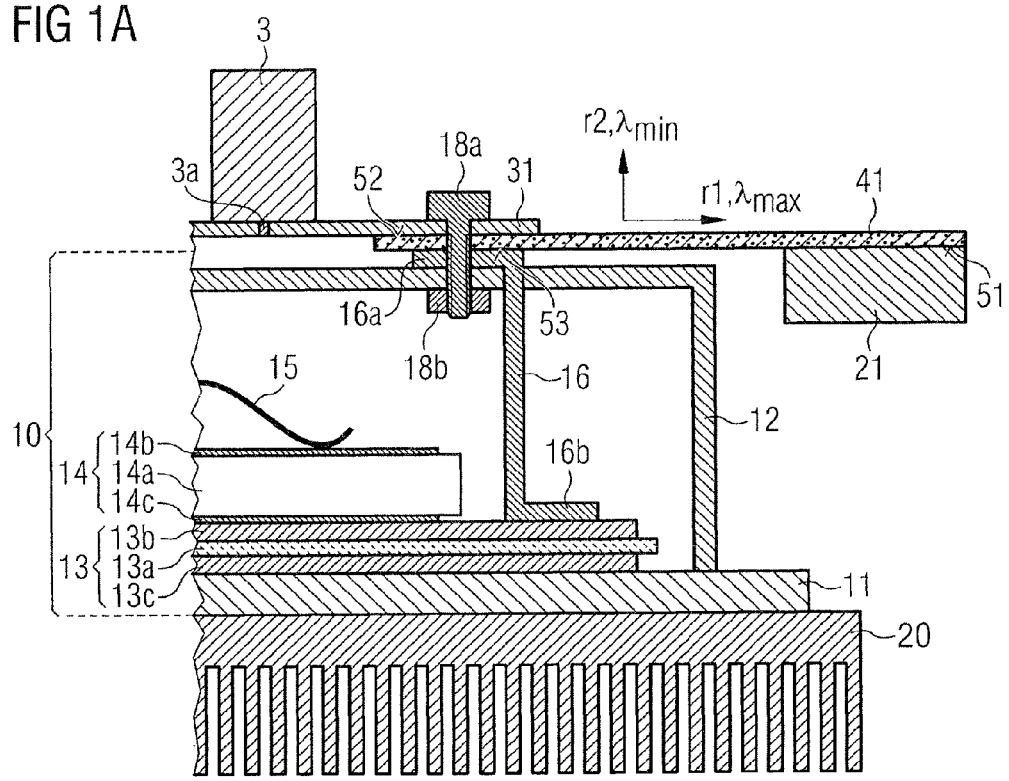
FIG. 1A is a vertical section through a portion of one embodiment of a power semiconductor module assembly in which a terminal is deheated by using an anisotropic thermally conductive heat dissipating element.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the figures, unless stated otherwise, like reference numerals identify like or corresponding elements having the same or corresponding function. Unless expressly stated otherwise, the figures are not true to scale, to make for a better representation.

One embodiment provides a power semiconductor module assembly which now makes it possible to avoid overheating of any component joined to such a terminal of a power semiconductor module. A further embodiment involves including an adapter module with which a terminal of a power semiconductor module can now be electrically conductive joined to a terminal of a power semiconductor module.

A first embodiment relates to a power semiconductor module assembly including a power semiconductor module including a load terminal and a power semiconductor chip, an electrically and thermally conductive contact conductor electrically conductively joined to the load terminal and to the power semiconductor chip, and a heat sink. Provided furthermore is an anisotropic thermally conductive heat dissipating element including a first contact face via which it is thermally coupled to the heat sink, a second contact face via which it is thermally coupled to the contact conductor, a third contact face via which it is thermally coupled to the contact conductor. In addition, the heat dissipating element features between the third contact face and the first contact face a first thermal resistor as well as between the third contact face and the second contact face a second thermal resistor which is greater than the first thermal resistor.

A second embodiment relates to a power semiconductor module assembly including a power semiconductor module including a load terminal and a power semiconductor chip as well as an electrically and thermally conductive contact conductor electrically conductively joined to the load terminal and to the power semiconductor, and a heat sink. Provided furthermore is an anisotropic thermally conductive heat dissipating element including a first contact face via which it is thermally coupled to the heat sink and a second contact face via which it is thermally coupled to the contact conductor and which is smaller than the first contact face.

A third embodiment relates to a power semiconductor module assembly including a power semiconductor module including a load terminal and a power semiconductor chip, as well as an electrically and thermally conductive contact conductor electrically conductively joined to the load terminal and to the power semiconductor chip, and a heat sink. Provided furthermore is an anisotropic thermally conductive heat dissipating element including a portion sandwiched between the load terminal and the first contact conductor, a first contact face via which it is thermally coupled to the heat sink, a second contact face via which it is thermally coupled to the contact conductor. At at least one location of the second contact face the heat dissipating element has in the direction of the normal n of the second contact face a second thermal conductivity which is smaller than the first thermal conductivity which at this location includes a vertical direction (t) perpendicular to the direction of the normal.

A fourth embodiment relates to an adapter for joining an external component to a power semiconductor module. Stacked in this adapter in a first direction are an electrically and thermally conductive first contact conductor, an anisotropic thermally conductive first heat dissipating element, an isolator layer, an anisotropic thermally conductive second heat dissipating element and an electrically and thermally conductive second contact conductor.

A fifth embodiment relates to a power semiconductor module assembly including a power semiconductor module including a first load terminal and a second load terminal as well as an adapter configured in accordance with the fourth embodiment. In this power semiconductor module assembly the first load terminal is electrically conductively joined to the first contact conductor and the second load terminal is electrically conductively joined to the second contact conductor.

Referring now to FIG. 1A there is illustrated a cross-section through a portion of power semiconductor module assembly including a power semiconductor module 10. The power semiconductor module 10 includes a power semiconductor chip 14 with a semiconductor substrate 14a featuring on opposite sides metallizations 14b, 14c. The top side metallization 14b and the bottom side metallization 14c are power terminals of the power semiconductor chip 14, for example drain and source, or emitter and collector, or anode and cathode. The power semiconductor chip 14 may be a diode, a field effect transistor such as e.g. a MOSFET or a junction field effect transistor (JFET), an IGBT, a thyristor, a triac or some other power semiconductor component. The power semiconductor chip 14 in accordance with the present example embodiment is a vertical component, but it could just as well be configured as a lateral component in which the power terminals with their metallizations 14b and 14c are located on one and the same side of the power semiconductor substrate 14a.

The power semiconductor chip 14 is mounted on a circuit substrate 13 and electrically conductively joined by using this circuit substrate 13 to a terminal 16 of the power semiconductor module 10. The circuit substrate 13 includes an isolation substrate 13a which may be configured e.g. as a ceramic platelet, suitable ceramics being, for example, aluminum oxide (Al2O3), aluminum nitride (AlN), silicon nitride (Si3N4).

The isolation substrate 13a includes a top side metallization 13b and an optional bottom side metallization 13c, whereby at least the top side metallization 13b can be patterned to configure a pattern of paths and/or pads, whereas the optional bottom side metallization 13c can be configured either as a planar layer or, however, also as a pattern of paths and/or pads.

The top side metallization 13b of the circuit substrate 13 serves to circuit the power semiconductor chip 14 electrically with other components of the power semiconductor module 10. At the side facing away from the circuit substrate 13 the electrical connection of the power semiconductor chip 14 is made by using at least one bond wire 15, instead of which, however, a metal tab may be provided fixedly and electrically conductively joined to a top side metallization 14b of semiconductor body 14a. A top side electrical contact of the semiconductor body 14a may also be made by using a punch pressed against a top side metallization 14b of the power semiconductor chip 14a (punched contact).

Also suitable as the circuit substrate 13 are direct copper bonding (DCB) substrates wherein the top side metallization 13b and the optional bottom side metallization 13c consist fully or at least mainly of copper and are directly joined to an isolation substrate 13a of aluminum oxide ceramic. As an alternative a circuit substrate 13 may also be formed as an active metal brazing (AMB) substrate.

The power semiconductor module 10 includes furthermore an optional base plate 11 as well as a case frame 12 forming together a case housing the power semiconductor chip 14 as well as further optional electronic components. For cooling the power semiconductor module 10 a heat sink 20 may be provided contacting the base plate 11 at the side facing away from the power semiconductor chip 14. As an alternative a heat transfer element, for instance a heat sink paste or foil may be sandwiched between the base plate 11 and the heat sink 20.

The electrically conductive connection between the bottom side metallization 14c of the power semiconductor chip 14 and the top side metallization 13b of the circuit substrate 13 may be achieved, for example, by soldering, by using an electrically conductive bond or by using a low-temperature joining technique (LTJT) in which a layer containing silver is sandwiched between the top side metallization 13b and bottom side metallization 14c and converted by application of pressure at a temperature in the region of roughly 230° C. into a durable, solid joining layer featuring a temperature resistance of better than approx 300° C.

The terminal 16 includes a foot 16b electrically conductively joined to the top side metallization 13b of the circuit substrate 13, a suitable joining technique in one or more embodiments being, for example, soldering, ultrasonic welding, laser welding, thermal conductive bonding or the low-temperature joining technique as explained above.

The portion 16a of the terminal 16 is brought out from the case frame 12 of the power semiconductor module 10 and is termed load terminal hereinafter. The terminal 16 may be configured, for example, as a punched sheet metal part suitably angled as a function of the wanted geometry and design of the module 1, e.g. as a function of how a multitude of power semiconductor chips 14 is distributed on the circuit substrate 13.

The bond wire 15 bonded to the top side metallization 14b may be electrically conductively joined to a further terminal configured the same as explained above with reference to the terminal 16.

Producing an electrically conductively connection between the load terminal 16a and a contact 3a of a component to be electrically joined to the power semiconductor module 10—in FIG. 1A illustrated, for example, as a capacitor 3—is done by using a low-resistance contact conductor 31 made e.g. in one embodiment purely or partly of copper. This contact conductor 31 make take the form of a busbar, but it also being possible to be a strip of foil or other forms.

Different joining techniques can be employed to produce an electrically conductive connection between the load terminal 16a and the contact conductor 31. In the arrangement as illustrated in FIG. 1A, for instance, a bolted connection including a nut 18b threaded to a bolt 18a is used. The bolt 18a is threaded through openings in the contact conductor 31 and load terminal 16a ending in the nut 18b. As an alternative such a connection can also be made by using a press-fit contact in which the load terminal 16a juts up vertically from the top side of the case frame 12 and pressed into an opening of the contact conductor 31, resulting in a press-fit connection. The load terminal 16a may likewise include a clamping device in which the contact conductor 31 is clamped to the terminal 16 by using a bolted or spring clamp.

To dissipate the heat materializing in the terminal 16 from operation of the power semiconductor module 10 an anisotropic thermally conductive heat dissipating element 41 is provided. This heat dissipating element 41, made for instance as a graphite film, features a first thermal conductivity $\lambda 1$ in a first direction r1 of the heat dissipating element 41 which is greater than a second thermal conductivity $\lambda\ 2$ in a second direction r2 of the heat dissipating element 41. In one embodiment of the invention the thermal conductivity $\lambda\ 1$ may constitute the maximum thermal conductivity $\lambda$ maximum of the heat dissipating element 41 and/or at $\lambda\ 2$ the minimum thermal conductivity $\lambda$ minimum of the heat dissipating element 41, but not necessarily so.

Figure 1B:
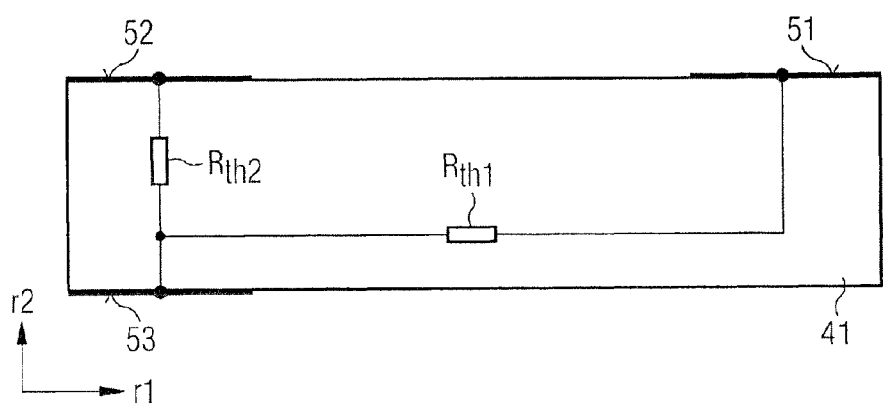
FIG. 1B is a vertical section through the heat dissipating element illustrated in FIG. 1A in which thermal resistors between various contact faces of the heat dissipating element are depicted diagrammatically.

Referring now to FIG. 1B there is illustrated how the heat dissipating element 41 includes a first contact face 51 via which it is thermally coupled to the heat sink 21, a second contact face 52 via which it is thermally coupled to the first contact conductor 31 as well as a third contact face 53 with which it is joined to the load terminal 16a. Sandwiched between the third contact face 53 and the first contact face 51 the heat dissipating element 41 includes a first thermal resistor Rth1, as well as between the third contact face 53 and the second contact face 52 a second thermal resistor Rth2. These thermal resistors Rth1 and Rth2 are depicted diagrammatically analogous to an electric circuit diagram in FIG. 1B merely illustrating the heat dissipating element 41 with the first 51, second 52 and third contact face 53 respectively. In the heat dissipating element 41 as a function of these different thermal resistors Rth1 and Rth2 a first heat flow $\Phi th1$ materializes from the third contact face 53 to the first contact face 51 and a second heat flow $\Phi th12$ from the third contact face 53 to the second contact face 52.

Referring now to FIG. 1C there is illustrated how these heat flows $\Phi th1$ and $\Phi th2$ differ qualitatively as indicated by the differing wide arrows, the first heat flow $\Phi th1$ being greater than the second heat flow $\Phi th2$. This is at least the case when the temperature of the first contact conductor 31 (see FIG. 1A) existing at the second contact face 52 is not significantly higher than the temperature of the heat sink 21 (see FIG. 1A) existing at the first contact face 51 which, however, is of no importance in actual practice as long as the heat sink 21 is adequately designed.

Due to the anisotropic thermal conductivity of the heat dissipating element 41 the heat materializing in the terminal 16 is dissipated mainly in the direction r1 starting from the load terminal 16a and communicated to a heat sink 21 which is thermally coupled to the heat dissipating element 41. Due to the good thermal conductivity $\lambda\ 1$ in the direction of the heat sink 21 and the comparatively low thermal conductivity $\lambda\ 2$ in the second direction r2 significantly less heat is communicated from the load terminal 16a to the contact conductor 31 than in an arrangement in which the contact conductor 31 is in direct contact with the load terminal 16a. Although, because of the joining elements 18a, 18b a hot spot materializes in the flow from the load terminal 16a to the contact conductor 31, the cross-surface area of the bolt 18a is small as compared to the cross-surface area as would materialize between the load terminal 16a and contact conductor 31 without the interposed heat dissipating element 41.

Furthermore, the cooling effect of the heat sink 21 increases with the size of the first contact face 51 which can be selected, for example, larger than the second contact face 52, or e.g. at least twice as large as the second contact face 52.

Referring now to FIG. 2 there is illustrated a cross-section through a planar or substantially planar anisotropic thermally conductive heat dissipating element 41 as may be employed in the power semiconductor assembly as explained with reference to FIG. 1A.

The heat dissipating element 41 includes in a first direction r1 along a path P1 a first thermal conductivity $\lambda\ 1$ as well as in a second direction r2 along a path P2 a second thermal conductivity $\lambda\ 2$ which is smaller than first thermal conductivity $\lambda\ 1$. Due to the anisotropic thermal conductivity any hot-spot materializing in the flow at a critical location in the heat dissipating element 41 is dissipated better in the first direction r1 than in the second direction r2. The first thermal conductivity $\lambda\ 1$ may be, for example, the maximum thermal conductivity of the first heat dissipating element 41 whereas the second thermal conductivity $\lambda\ 2$ may be for instance the minimum thermal conductivity of the first heat dissipating element 41, in each of these optional cases the first direction r1 and second direction r2 constituting the directions of maximum thermal conductivity and minimum thermal conductivity respectively.

Depending on the inner structure of the heat dissipating element 41 the directions of maximum thermal conductivity and minimum thermal conductivity may stand, for instance, perpendicular to each other or include an angle greater than 0° and smaller than 90°. In one example embodiment in which the heat dissipating element 41 is configured as a planar graphite film the directions of maximum thermal conductivity and minimum thermal conductivity stand perpendicular to each other.

Figure 3:
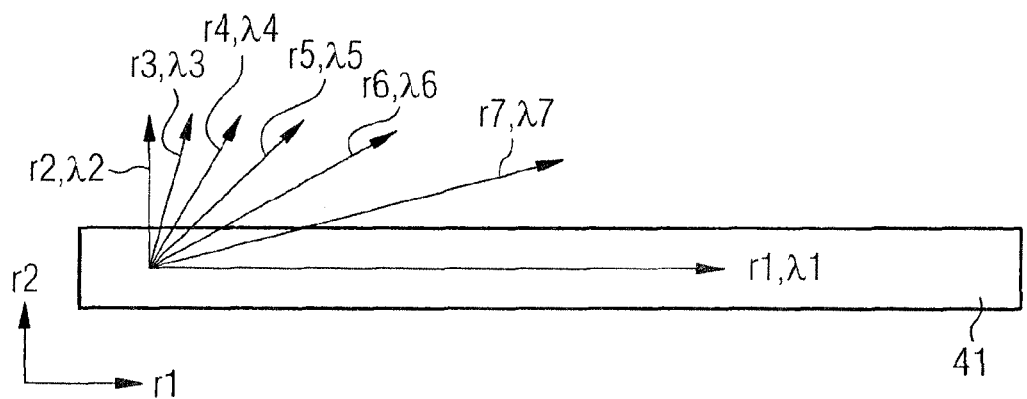
FIG. 3 is a cross-section through the anisotropic thermally conductive heat dissipating element as illustrated in FIG. 2 illustrating the various thermal conductivities as a function of the direction.

Referring now to FIG. 3 there is illustrated again the heat dissipating element 41 as illustrated in FIG. 2, but now additionally diagrammatically explaining how the thermal conductivity is a function of the various directions r1, r2, r3, r4, r5, r6, r7. The length of the directional arrows r1 to r7 serves as a measure of the thermal conductivity in the corresponding direction, i.e. the longer an arrow, the greater the thermal conductivity of the heat dissipating element 41 in the direction of the corresponding arrow.

The maximum thermal conductivity λ 1 lies in the direction r1, the minimum thermal conductivity λ 2 in the direction r2. Starting from the direction r2 the thermal conductivity increases all the more in the directions r3, r4, r5, r6, r7 to r1 with the assigned thermal conductivities λ 2, λ 3, λ 4, λ 6, λ 7 and λ 1 respectively.

Figure 4:
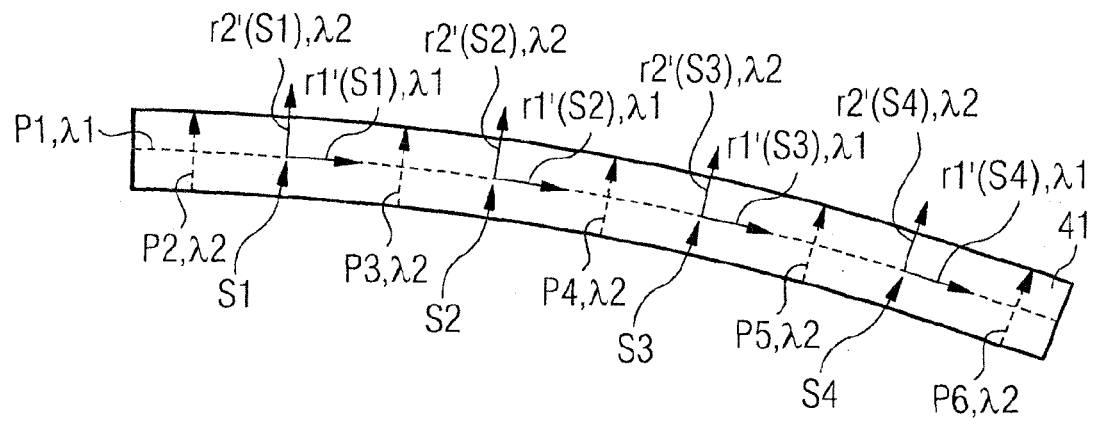
FIG. 4 is a cross-section through a curved anisotropic thermally conductive heat dissipating element.

Referring now to FIG. 4 there is illustrated how the heat dissipating elements 41 as illustrated in FIGS. 2 and 3 are configured substantially planar, although basically heat dissipating elements 41 having anisotropic thermally conductivity, such as, for example, the aforementioned graphite film, may also take on another form, an example of which being a cross-sectional view of a curved portion of graphite film as illustrated in FIG. 4. because of this curvature the directions in which the heat dissipating element 41 exhibits a certain thermal conductivity can no longer be cited uniformly for the complete heat dissipating element 41. Instead, the directions assigned a certain thermal conductivity are now a function of the location as is illustrated by way of example in FIG. 4 by the directions r1' and r2'.

Illustrated by way of example are various locations S1, S2, S3 and S4 in the heat dissipating element 41 to each of which a direction r1' (S1), r1' (S2), r1' (S3), r1' (S4) is assigned locally in which the heat dissipating element 41 has a first thermal conductivity λ 1, it having a second thermal conductivity λ 2 at the locations S1, S2, S3 and S4 to each of which a r2' (S1), r2' (S2), r2' (S3), r2' (S4) is assigned locally.

In this way path P1 can be defined within the heat dissipating element 41 at least for certain arrays along which the heat dissipating element 41 features a constant thermal conductivity—again locally in each case—in the direction of the path. Illustrated by way of example in the example embodiment as illustrated in FIG. 4 are the various P2, P3, P4, P5 and P6 along which the first heat dissipating element 41 has a second thermal conductivity λ 2 in each case in the direction of the path.

Figure 6:
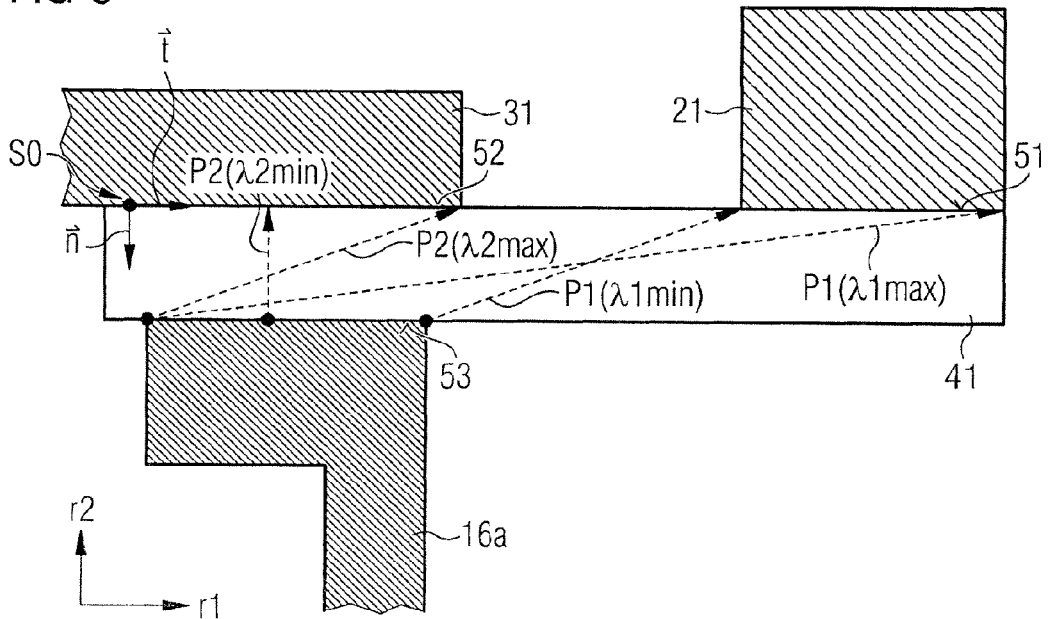
FIG. 6 is a cross-section through the heat dissipating element as illustrated in FIG. 5 illustrating paths having a maximum or a minimum thermal conductivity.
Figure 7:
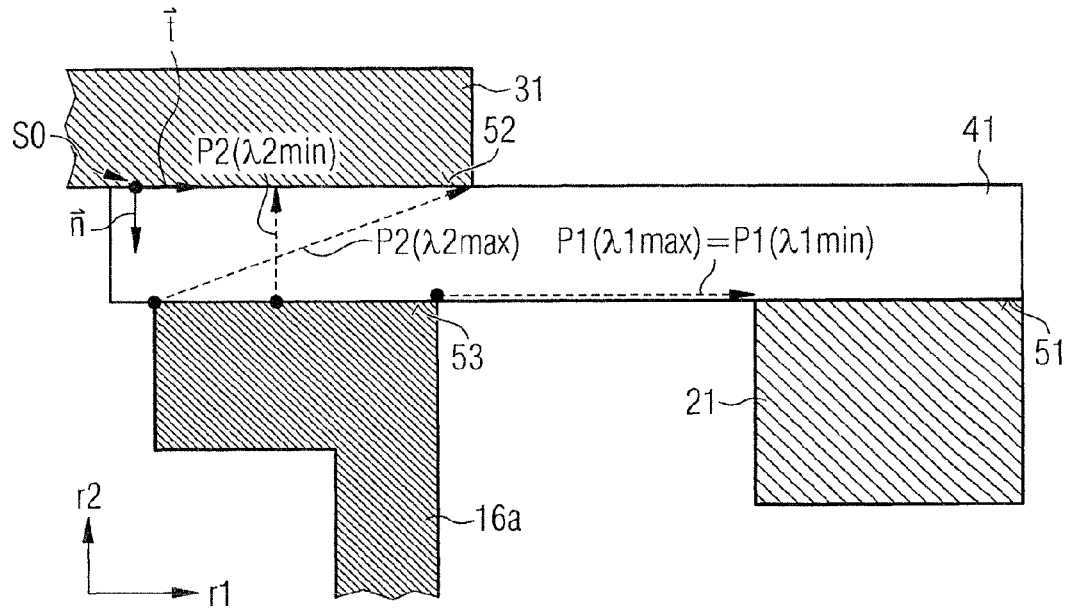
FIG. 7 is a cross-section through a portion of a power semiconductor module assembly illustrating the shortest possible paths running within a heat dissipating element from a load terminal to a contact conductor, respectively from the load terminal to a heat sink.

Each of the following FIGS. 5 to 7 features a load terminal 16a which, as explained with reference to FIG. 1A, is thermally coupled by using an anisotropic thermally conductive heat dissipating element 41 to a heat sink 21 and to a contact conductor 31. Illustrated in each case is a different path along which the thermal conductivity of the heat dissipating element 41—again corresponding in the direction of the path—is constant. The power semiconductor module assembly involved may be configured, for example, as explained above with reference to FIG. 1A. To make for a better overview in FIGS. 5 to 7 depicting the joining elements for producing an electrically conductively connection between the load terminal 16a and the contact conductor 31 as well as depicting a case of the power semiconductor module is omitted.

The heat dissipating element 41 includes a first contact face 51 via which it is thermally coupled to the heat sink 21, it being furthermore thermally coupled by using a second contact face 52 to the first contact conductor 31 and by using a third contact face 53 to the load terminal 16a.

Figure 5:
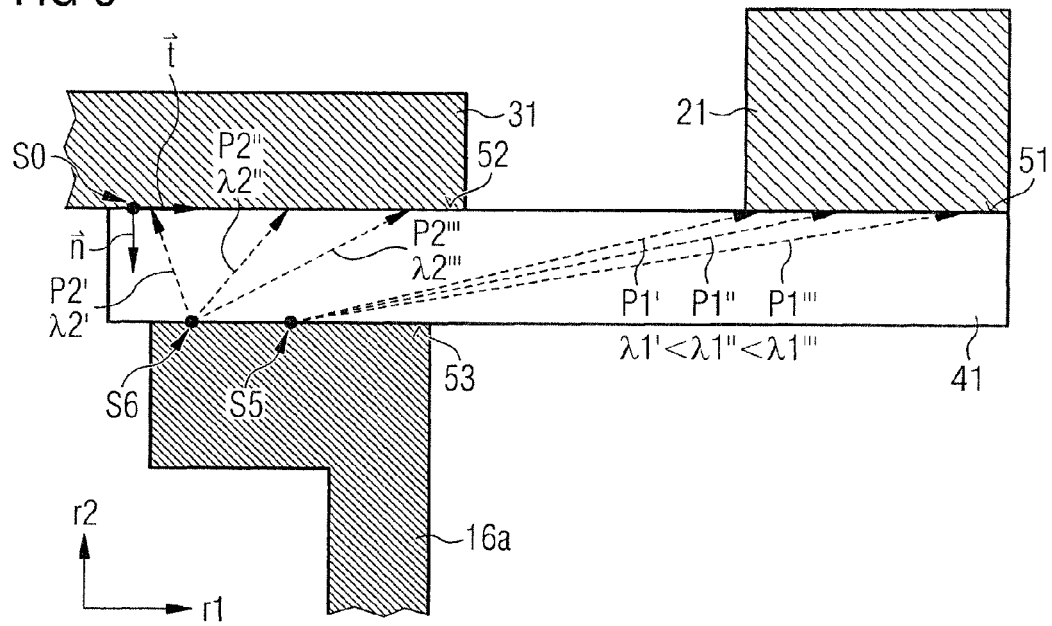
FIG. 5 is a cross-section through a planar anisotropic thermally conductive heat dissipating element as illustrated in FIG. 2 illustrating a possible run of a first path.

Referring now to FIG. 5 there is illustrated how, in each case, the thermal conductivity is achieved directly, although, as an alternative further elements for a good thermal conductivity may also be provided—each independently of the other—between the heat dissipating element 41 and the heat sink 21, between the heat dissipating element 41 and the first contact conductor 31 as well as between the heat dissipating element 41 and the load terminal 16a. In this case the contact faces 51, 52, 53 materialize in the surface portions of the heat dissipating element 41 in which the heat dissipating element 41 has direct contact with one or more such further elements.

When the load terminal 16a becomes heated up, a heat flow materializes, starting with the contact face 53, in the direction of the heat sink 21 as well as in the direction of the contact conductor 31. Starting from a certain point in the contact face 53 different paths can be defined in the heat dissipating element 41 along which the heat dissipating element 41 exhibits a constant thermal conductivity in the direction of the path. To illustrate this, two points S5 and S6 of the third contact face 53 are illustrated by way of example in FIG. 5. Starting from point S5 the heat is propagated in the direction of the first contact face 51 featuring along paths P1', P1" and P1''', along each of which the heat dissipating element 41—each in the direction of the corresponding path P1', P1" and P1'''—a thermal conductivity λ 1', λ 1" and λ 1''' respectively assigned to the corresponding path. In the example embodiment as illustrated in FIG. 5 the thermal conductivity λ 1" is greater than the thermal conductivity λ 1' and smaller than the thermal conductivity λ 1'''. The paths P2', P2" and P2''' can be correspondingly defined starting from the point S6 in the direction of the second contact face 52 along which—again in the direction of the path in each case—the thermal conductivity λ 2', λ 2" and λ 2''' is constant.

When taking into consideration the sum of all possible paths running within the heat dissipating element 41 from the third contact face 53 to the first contact face 51, along which the thermal conductivity of the heat dissipating element 41 is constant in each case in the direction of the path, then this sum includes paths along which the thermal conductivity of the heat dissipating element 41 is a maximum and such, along which the thermal conductivity is a minimum.

Correspondingly, from the sum of the paths P2', P2" and P2''' running within the heat dissipating element 41 from the third contact face 53 to the second contact face 52 paths having maximum or minimum thermal conductivity in the direction of the path can be selected having a constant thermal conductivity of the heat dissipating element 41 in the path direction.

Referring now to FIG. 6 there is illustrated for the example embodiment as illustrated in FIG. 5 those paths having maximum or minimum thermal conductivity of the heat dissipating element 41 in the direction of the path for each path between the third contact face 53 and the first contact face 51 as well as for paths between the third contact face 53 and the second contact face 52. Along a path P1 (λ 1max) the heat dissipating element 41 exhibits a thermal conductivity λ 1max in the direction of the path which is the maximum of a path running within the heat dissipating element 41 from the third contact face 53 to the first contact face 51 having a constant thermal conductivity of the heat dissipating element 41 in the direction of the path. Correspondingly, the first heat dissipating element 41 exhibits along a path P1(λ 1min) a thermal conductivity λ 1min representing the minimum possible thermal conductivity of any path running from the third contact face 53 to the first contact face 51 within the heat dissipating element 41 having in the direction of the path a constant thermal conductivity of the heat dissipating element 41.

Correspondingly in this way paths having maximum or minimum thermal conductivity can also be established for paths running between the third contact face 53 and the second contact face 52 having a constant thermal conductivity in the direction of the path. Thus, for example as illustrated in FIG. 6, the maximum possible thermal conductivity along a path running within the heat dissipating element 41 between the third contact face 53 and the second contact face 52 having constant thermal conductivity of the heat dissipating element 41 in the direction of the path is termed λ 2max. This occurs along a path P2(λ 2max). Correspondingly, a minimum 2min can be established representing the minimum thermal conductivity of the heat dissipating element 41 along a path between the third contact face 53 and the second contact face 52 having a constant thermal conductivity in the direction of the path, this corresponding path being termed P2(λ 2min).

The material used for the heat dissipating element 41 as well as the geometry of the heat dissipating element 41 can be selected in conjunction with the orientation thereof and the size of the contact faces 51, 52, 53 that the thermal conductivity λ 1max is greater than the thermal conductivity λ 2min or greater than the λ 2max. As an alternative or in addition thereto the λ 1min may be greater than the thermal conductivity λ 2min or greater than the thermal conductivity λ 2max.

Referring now to FIG. 7 there is illustrated how, whilst the heat sink 21 in the arrangement as illustrated in FIGS. 5 and 6 is arranged on the same side of the heat dissipating element 41 as the first contact conductor 31 the arrangement differs from that as illustrated in FIGS. 5 and 6 in that the heat sink 21 is arranged on the same side of the heat dissipating element 41 as the load terminal 16a. As is evident, due to the change in the position of the heat sink 21 the run of the paths P1(λ 1min) and P1(λ 1max) is different.

In the arrangement as illustrated in FIG. 7 the maximum thermal conductivity λ 1max and the minimum thermal conductivity λ 1min are identical but it is to be noted that the thermal conductivity λ 1max as illustrated in FIG. 7 generally differs from the thermal conductivity λ 1max as illustrated in FIG. 6, the same applying to the thermal conductivities λ 1min in FIGS. 6 and 7.

Due to arrangement of the load terminal 16a, contact conductor 31 and heat dissipating element 41 being unchanged relative to each other as compared to the arrangement as illustrated in the FIGS. 5 and 6, the path P2 (λ 2 maximum) assigned thermal conductivity λ 2max and path P2 (λ 2 minimum) assigned thermal conductivity λ 2min are likewise unchanged. The thermal conductivities λ 1max and λ 1min are greater than the thermal conductivity λ 2min and may be also optionally greater than the thermal conductivity λ 2max.

In accordance with the second embodiment which as explained at the outset may be provided in a power semiconductor module assembly as an alternative or in addition to a first embodiment, the anisotropic thermally conductive heat dissipating element 41 includes as evident from FIGS. 5 to 7 a first contact face 51 via which it is thermally coupled to the heat sink 21. For this purpose the heat sink 21 may directly contact the heat dissipating element 41 as illustrated in FIG. 1A, but as an alternative thereto a further component may be sandwiched between the heat dissipating element 41 and the heat sink 21. When, for example, the heat sink 21 and the heat dissipating element 41 are to be electrically isolated from each other a thermally conductive dielectric e.g. as a film of a silicone elastomer, a silicone gel, polyamide or of a phase-changing material such as a mica pad, ceramic platelet, and the like, may be provided. When no isolation is needed the further component may also be a thermally conductive adhesive or paste. In case one or more of such further components are included, the contact face 51 materializes from the contact face between the heat dissipating element 41 and one or more of these further components.

In addition, the heat dissipating element 41 features a second contact face 52 via which it is thermally coupled to the first contact conductor 31. The second contact face 52 in this arrangement may be smaller than the first contact face 51 so that a not unsubstantial proportion of the heat materializing in the load terminal 16a flows off to the heat sink 21 and from there to the environment.

The heat dissipating element 41 includes in addition a third contact face 53 via which it is thermally coupled to the first contact conductor 31. Along a first path P1(λ 1min) running the shortest possible within the heat dissipating element 41 (see FIGS. 6 and 7) extending from the third contact face 53 to the first contact face 51, the heat dissipating element 41 has at least one location in the first path P1(1min) a minimum first thermal conductivity λ 1min in the direction of the path.

In addition, the heat dissipating element 41 has a second path P2(λ 2max) running the shortest possible within the heat dissipating element 41 extending from the third contact face 53 to the first contact face 51, the heat dissipating element 41 at at least one location in the second path P2(λ 2max) a maximum second thermal conductivity λ 2max in the direction of the path which is smaller than the first thermal conductivity λ 1min.

Figure 8:
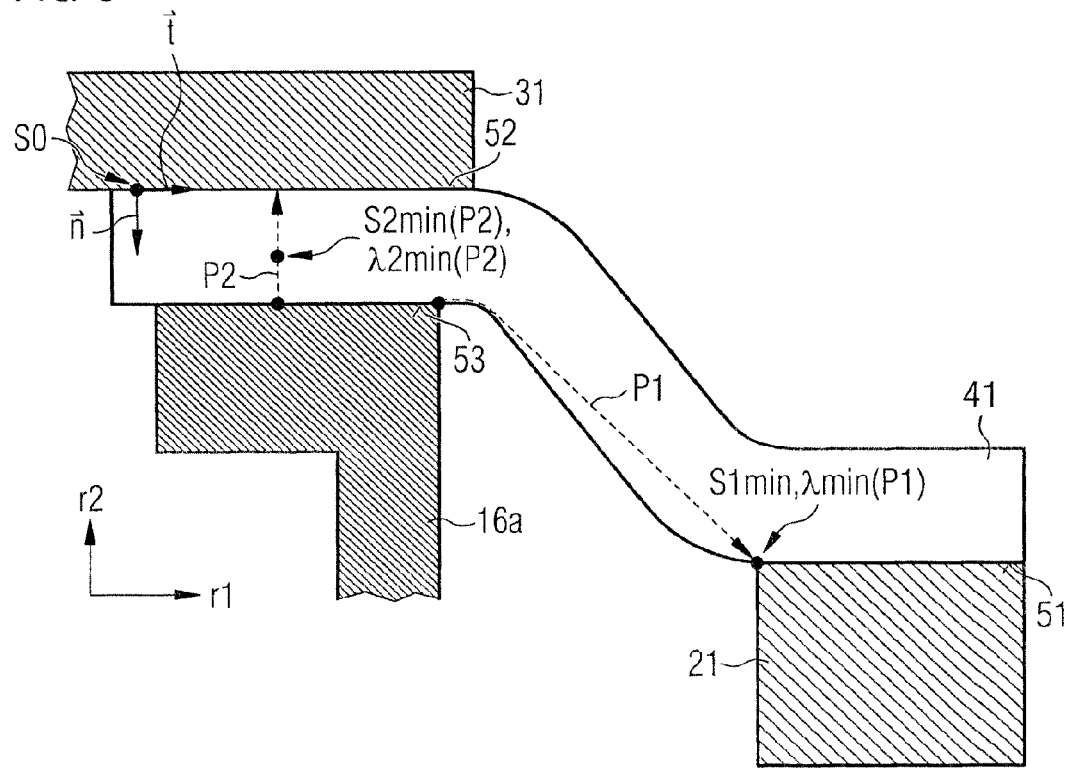
FIG. 8 is a cross-section through a power semiconductor module assembly illustrating the shortest possible paths patterned within a curved heat dissipating element from a load terminal to a contact conductor, respectively from the load terminal to a heat sink.

Referring now to FIG. 8 there is illustrated an arrangement as illustrated in FIG. 7 with the difference that the heat dissipating element 41 is curved, resulting in path P1 running shortest possible within the heat dissipating element 41 from the third contact face 53 to the first contact face 51 other than as illustrated in FIG. 7. Along the path P1 the thermal conductivity of the heat dissipating element 41 existing in the direction of the path varies, it being a minimum λ 1min(P1) at a location S1 min sited for example at the end of the path P1 at the first contact face 51.

In another run of the curvature of the heat dissipating element and/or a heat dissipating element having a different structure as regards the thermal conductivity a corresponding minimum λ 1min(P1) must necessarily occur at one end of the path, i.e. at one of the contact faces 51, 53. Such a minimum may also exist at one or more locations of the path between the ends of the path.

Figure 9:
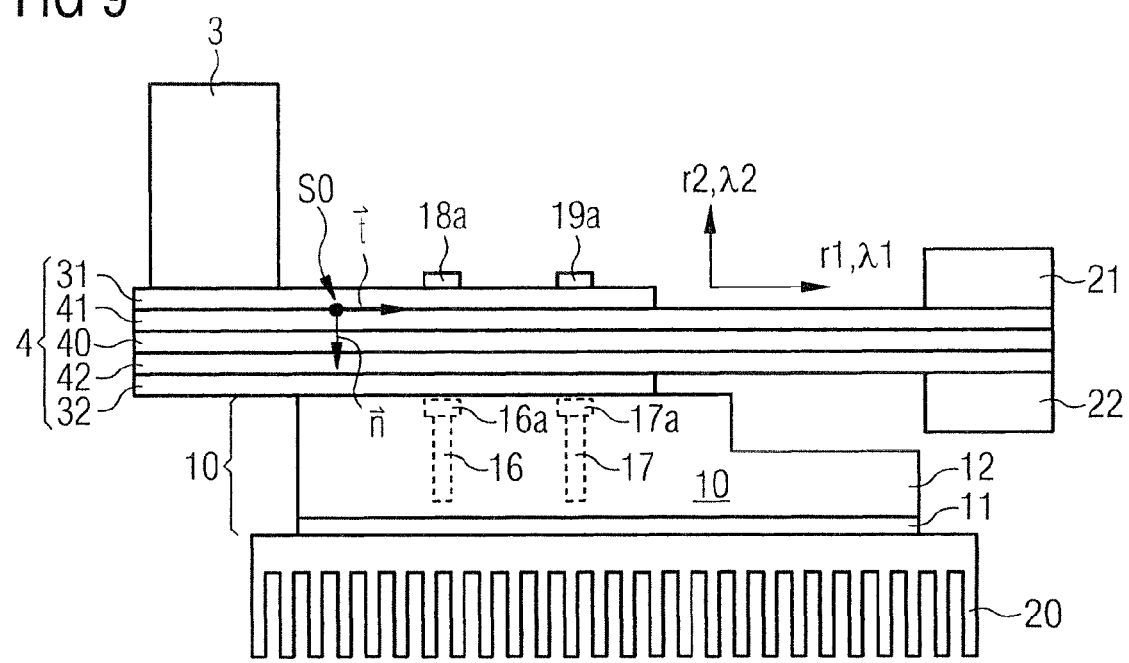
FIG. 9 is a side view of a power semiconductor module assembly including two load terminals to which a further electric component is joined by using an adapter including two contact conductors.

Referring now to FIG. 9 there is illustrated a power semiconductor module assembly including a power semiconductor module 10 as may be configured the same as a power semiconductor module as explained with reference to FIG. 1A. The power semiconductor module 10 includes likewise a base plate 11 in thermal contact with a heat sink 20 at the side facing away from the semiconductor chip (not illustrated). The power semiconductor module 10 features a terminal 16 as well as a load terminal 16a electrically conductively joined to the terminal 16 and which may be optionally configured integral therewith. The power semiconductor module 10 includes in addition a further terminal contact 17 as well as a load terminal 17a electrically conductively joined to the terminal contact 17 and which, again, may be optionally configured integral therewith. The terminals 16 and 17 as well as the load terminals 16a, 17a may be configured and electrically conductively joined with a contact conductor the same as the terminal 16 and load terminal 16a respectively including the joining technique thereof to produce an electrically conductively connection with the contact conductor 31 as explained earlier with reference to FIG. 1A.

The load terminals 16a, 17a may be provided, for example, to power the power semiconductor module 10, in one embodiment the load terminals 16a, 17a may also serve to output a voltage to power a load to be joined to the power semiconductor module 10. But in any case it is necessary to electrically conductively join the load terminals 16a, 17a to a further component which, as illustrated in FIG. 9 is, for example, a capacitor 3 featuring two terminals (not illustrated) one of which is electrically conductively joined to the load terminal 16a and the other to the load terminal 17a.

To produce an electrically conductively connection an adapter 4 is provided as a stack of an electrically and thermally conductive contact conductor 31, an anisotropic thermally conductive heat dissipating element 41, an isolator layer 40, an anisotropic thermally conductive second heat dissipating element 42, an electrically and thermally conductive second contact conductor 32, wherein the first contact conductor 31 and the second contact conductor 32 are electrically isolated from each other by at least the isolator layer 40.

The first contact conductor 31 connects a first terminal of the capacitor 3 electrically conductively joined to the load terminal 16a. Correspondingly, the second contact conductor 32 electrically conductively connects a second terminal of the capacitor 3 to the load terminal 17a.

The corresponding electrically conductively connections can be made, for example, by using bolt 18a and 19a respectively. The bolt 18a is electrically conductively joined to the load terminal 16a and to the first contact conductor 31, the bolt 19a to the load terminal 17a and to the second contact conductor 32. As an alternative to bolted terminals other joining techniques may also be employed, e.g. the joining techniques as explained with reference to FIG. 1A for joining the terminal 16 to the contact conductor 31 illustrated therein.

The assembly as illustrated in FIG. 9 includes a first heat sink 21 and a second heat sink 22 contacting the first contact conductor 31 and second contact conductor 32 respectively in thus making it possible to cool the corresponding contact conductor 31 and 32, although it may be basically sufficient to provide just one of the heat sinks 21 or 22. But where the isolator layer concerned has poor thermal conductivity it is an advantage to provide a separate heat sink 21 and 22 for each contact conductor 31, 32 respectively. It is just as possible to use a common heat sink whereby to avoid a short-circuit at least one of the contact conductors 31, 32 needs to be isolated from the common heat sink when the latter is electrically conductive.

The first heat dissipating element 41 has a thermal conductivity in a first direction r1 which is smaller than a thermal conductivity in a second direction r2 perpendicular to the first direction. The second heat dissipating element 42 also has a thermal conductivity in a first direction r1 which is smaller than a thermal conductivity in a second direction perpendicular to the first. Structuring an adapter 4 in this way is achievable, for example, by stacking the first contact conductor 31, first heat dissipating element 41, isolator layer 40, second heat dissipating element 42 and the second contact conductor 32 laminated interjoined. Such a composite assembly substantially simplifies producing electrically conductive connections from and to power semiconductor modules.

In the first direction r1 the thermal conductivity of the first heat dissipating element 41 and/or the thermal conductivity of the second heat dissipating element 42 may is greater than 400 W/(K·m) for example. In addition, the thermal conductivity of the first heat dissipating element 41 and/or the thermal conductivity of the second heat dissipating element 42 in the second direction r2 may be smaller than isolator layer 40 W/(K·m).

The adapter 4 as illustrated in FIG. 9 has the additional advantage that the heat dissipating elements 41, 42 and the isolator layer 40 are sandwiched between the contact conductors 31 and 32 and are thus stabilized thereby as is particularly an advantage when at least one of the components sandwiched between the contact conductors 31 and 32 has such a low mechanical stability of its own that it would pose a risk of damaging these elements without being stabilized. Accordingly, the first heat dissipating element 41 and/or the second heat dissipating element 42 may be configured as a film of graphite, for example.

As regards their orientation and as regards the materials used, the heat dissipating element 41 and/or the heat dissipating element 42 may be selected so that they achieve their maximum thermal conductivity in the first direction r1 and their minimum thermal conductivity in the second direction r2.

Figure 10:
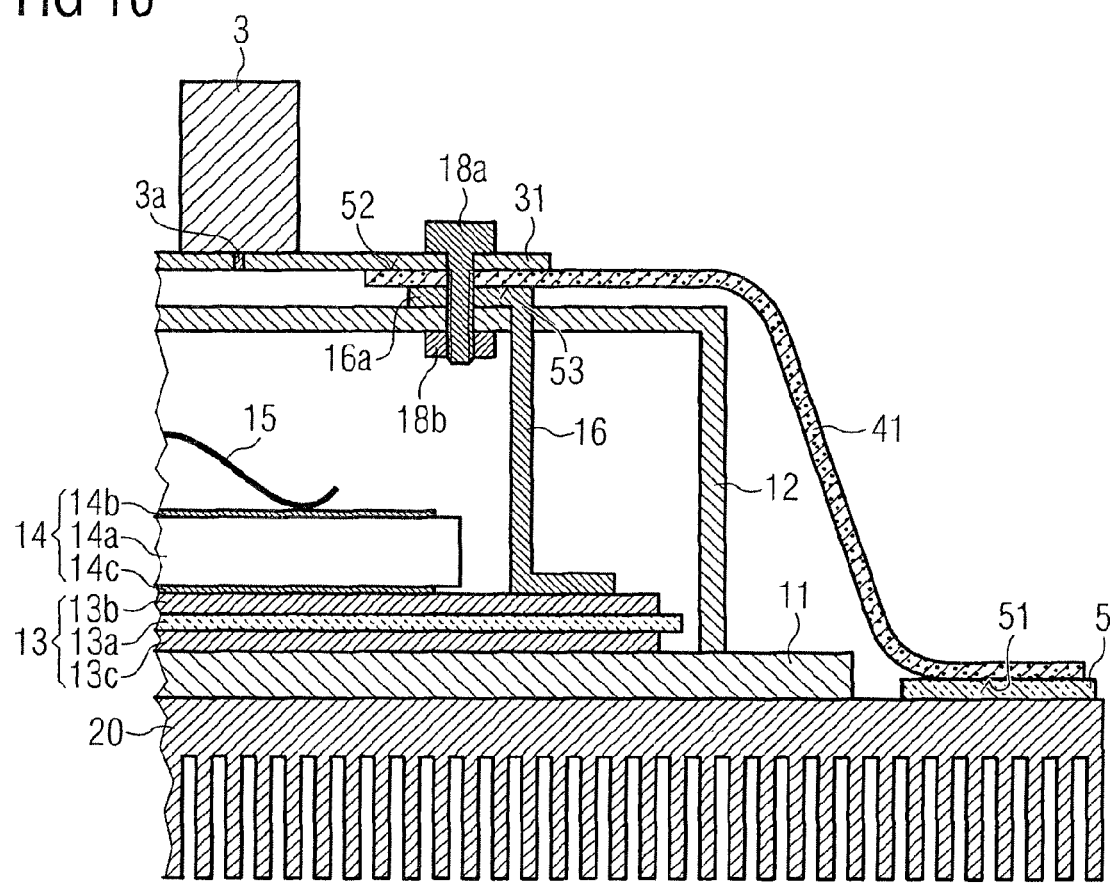
FIG. 10 is a cross-section through a portion of a power semiconductor module assembly including a flexible heat dissipating element thermally coupled to a heat sink sited on the side of a base plate of the power semiconductor module facing away from the power semiconductor chip, it being thermally coupled to the base plate.

Referring now to FIG. 10 there is illustrated a modification of the power semiconductor module assembly as illustrated in FIG. 1A, the modification being that the anisotropic thermally conductive heat dissipating element 41 as, for example, a graphite film, is configured not flat but curved. By a suitable curvature the heat dissipating element 41 can be optionally coupled to the heat sink 20 mounted on the side of the optional base plate 11 facing away from the power semiconductor chip 14 and thermally coupled thereto. Optionally the heat sink 20 may also be electrically isolated by using a thermally conductive dielectric 5 from the heat dissipating element 41. As the heat sink 20 sited on the side of the base plate 11 facing away from the power semiconductor chip 14 and thermally coupled thereto one of the heatsinks 21, 22 may also be used, for example, and brought into contact with the heat dissipating element 41 in the way as was already explained with reference to the FIGS. 1 and 5 to 8.

Each of the example embodiments as explained with reference to the preceding FIGs. also show the third embodiment. For this purpose the FIGS. 5 to 9 illustrate, for example, a location S0 of the second contact face 52, it being at least at this location S0 that the heat dissipating element has in the direction of the normal (n) of the second contact face 52 a second thermal conductivity which is smaller than the first thermal conductivity as exhibited at this location s0 in a direction vertical direction t perpendicular to the direction of the normal (n). Optionally in each case the first thermal conductivity may equal the maximum thermal conductivity and the second thermal conductivity may equal the minimum thermal conductivity of the heat dissipating element 41.

The embodiments as explained above as regards a power semiconductor module assembly may be employed in any combination thereof, but not necessarily so, since basically a power semiconductor module assembly may also feature just one of any of the embodiments, one, two, three and five which, as long as they are not conflicting, can be employed in any combination with each other.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module assembly comprising:
a power semiconductor module comprising a load terminal and a power semiconductor chip;
an anisotropic thermally conductive heat dissipating element comprising
a first contact face thermally coupled to a first heat sink,
a second contact face thermally coupled to an electrically and thermally conductive contact conductor electrically conductively joined to the load terminal and to the power semiconductor chip, a third contact face thermally coupled to the load terminal, where the heat dissipating element is defined by a first thermal resistor between the third contact face and the first contact face; and a second thermal resistance which is greater than the first thermal resistance between the third contact face and the second contact face.

2. The assembly of claim 1 wherein a portion of the heat dissipating element is sandwiched between the load terminal and the contact conductor.

3. The assembly of claim 1 wherein the heat dissipating element is a graphite film.

4. The assembly of claim 1 wherein the heat dissipating element comprises at at least one location in at least one direction a maximum thermal conductivity which is greater than 400 W/(K·m).

5. The assembly of claim 1 wherein the heat dissipating element comprises at at least one location in at least one direction a minimum thermal conductivity which is smaller than 40 W/(K·m).

6. The assembly of claim 1 wherein the heat dissipating element comprises at at least one location of the second contact face in the direction of the normal of the second contact face a second thermal conductivity smaller than a first thermal conductivity which the heat dissipating element comprises at the location in a direction perpendicular to the direction of the normal.

7. The assembly of claim 6 wherein the first thermal conductivity equals the maximum thermal conductivity of the heat dissipating element.

8. The assembly of claim 6 wherein the second thermal conductivity equals the minimum thermal conductivity of the heat dissipating element.

9. The assembly of claim 6 wherein the first thermal conductivity amounts to at least ten times the second thermal conductivity.

10. The assembly of claim 1 wherein the first contact area is at least twice as large as the second contact area.

11. The assembly of claim 1 wherein the power semiconductor module comprises a base plate thermally coupled to the first heat sink.

12. The assembly of claim 1 wherein the heat dissipating element is electrically isolated from the first heat sink by a thermally conductive dielectric.

13. The assembly of claim 1 wherein the power semiconductor module comprises a base plate thermally coupled at its side facing away from the power semiconductor chip to a second heat sink.

14. The assembly of claim 1 wherein the contact conductor is configured as a steep busbar.

15. The assembly of claim 1 wherein the contact conductor is configured as a flexible conductor layer.

16. A power semiconductor module assembly including
a power semiconductor module comprising a load terminal and a power semiconductor chip;
an electrically and thermally conductive contact conductor electrically conductively joined to the load terminal and to the power semiconductor chip;
a heat sink;
an anisotropic thermally conductive heat dissipating element comprising a first contact area via which it is thermally coupled to the heat sink, and a second contact area via which it is thermally coupled to the contact conductor and which is smaller than the first contact area.

17. The assembly of claim 16 wherein the heat dissipating element comprises a third contact face via which it is thermally coupled to the load terminal, wherein
the heat dissipating element comprises along a first path P1 running the shortest possible within the heat dissipating element from the third contact face to the first contact face, at at least one location a minimum first thermal conductivity in the direction of the path; and
the heat dissipating element comprises along a second path P2 running the shortest possible within the heat dissipating element from the third contact face to the second contact face, at at least one location a maximum second thermal conductivity in the direction of the path which is smaller than the first thermal conductivity.

18. A power semiconductor module assembly comprising:
a power semiconductor module comprising a load terminal and a power semiconductor chip;
an electrically and thermally conductive contact conductor electrically conductively joined to the load terminal and to the power semiconductor chip;
a heat sink; and
an anisotropic thermally conductive heat dissipating element comprising a portion sandwiched between the load terminal and the contact conductor,
the heat dissipating element comprising a first contact face via which it is thermally coupled to the heat sink and a second contact face via which it is thermally coupled to the first contact conductor, the heat dissipating element comprising at at least one location of the second contact face in the direction of the normal of the second contact face a second thermal conductivity which is smaller than the first thermal conductivity which the heat dissipating element comprises at the location in a direction perpendicular to the direction of the normal.

* * * * *